United States Patent [19]
Davis et al.

[11] Patent Number: 5,008,523
[45] Date of Patent: Apr. 16, 1991

[54] CURRENT MEASURING CIRCUIT WITH MEANS FOR NULLIFYING THE EFFECTS OF CURRENT SOURCE AND LEAD RESISTANCE

[75] Inventors: Rex M. Davis, West Chester; Mark E. Greiner, Mason, both of Ohio

[73] Assignee: Cincinnati Electronics Corporation, Cincinnati, Ohio

[21] Appl. No.: 412,715

[22] Filed: Sep. 26, 1989

[51] Int. Cl.$^5$ .................................... H01J 40/14
[52] U.S. Cl. .................. 250/214 A; 307/491; 330/260
[58] Field of Search ............ 250/206, 214 R, 214 A, 250/214 C; 307/311, 491, 494; 330/260

[56] References Cited

U.S. PATENT DOCUMENTS

| | | | |
|---|---|---|---|
| Re. 28,851 | 6/1976 | Milkovic | 323/6 |
| 3,962,631 | 6/1976 | Poppinger | 324/119 |
| 4,182,982 | 1/1980 | Wolf et al. | 324/127 |
| 4,354,155 | 10/1982 | Speidel et al. | 324/133 |
| 4,513,245 | 4/1985 | Yokoyama | 324/119 |
| 4,584,525 | 4/1986 | Harnden, Jr. et al. | 324/126 |
| 4,713,607 | 12/1987 | Pepper | 324/73 PC |
| 4,906,834 | 3/1990 | Quad | 250/214 A |

*Primary Examiner*—David C. Nelms
*Attorney, Agent, or Firm*—Lowe, Price, LeBlanc, Becker & Shur

[57] ABSTRACT

Current derived from an indium arsenide current generating photodetector is determined accurately, despite the presence of a variable resistance between terminals of the photodetector and the photodetector having leads with appreciable resistance connected to the detector terminals. Two leads are connected to each detector terminal. The two leads connected to one of the detector terminals are respectively connected to an inverting input terminal of an operational amplifier and to one terminal of a feedback resistor of the amplifier; the other terminal of the feedback resistor is connected to the amplifier output terminal. The two leads connected to the other terminal of the photodetector are respectively connected to the operational amplifier non-inverting input terminal and to ground. The operational amplifier derives an output voltage that accurately represents the output current of the photodetector, independently of the photodetector resistance and the lead wire resistance.

10 Claims, 1 Drawing Sheet

CURRENT MEASURING CIRCUIT WITH MEANS FOR NULLIFYING THE EFFECTS OF CURRENT SOURCE AND LEAD RESISTANCE

FIELD OF INVENTION

The present invention relates generally to circuits for detecting the current derived from current sources having variable internal resistance and relatively high resistance lead wires and more particularly to such a circuit wherein the current generator includes two leads connected to each terminal thereof, which leads are connected to inverting and non-inverting input terminals of an operational amplifier, a feedback resistor of the amplifier and to ground.

BACKGROUND ART

An indium arsenide photodiode, when irradiated by optical energy, generates a current that is directly proportional to the photon rate of the optical energy incident thereon, i.e., the magnitude of current generated by the photodiode is directly proportional to the number of photons per second incident on the photodiode. Transimpedance amplifiers have typically been used to derive voltages indicative of the current generated by indium arsenide photodetectors. Such amplifiers are employed because they have very low input impedance.

Typical lead wires for indium arsenide photodetectors are fabricated of gold and have diameters of approximately 1 mil, resulting in a resistance of approximately 10 ohms per foot. Lead wires having these characteristics are compatible with indium arsenide bonding pads because of the minimum pressures exerted by the lead wires on the bonding pads and because of the compatibility of gold with other materials of the indium arsenide photodetectors. The small gold wires also minimize heat conduction in cryogenic environments where the photodiode is cooled. For laboratory measurement purposes, the lead wires typically are 1 to 1 ½ feet long; for operational measurement purposes, the lead wires are a few inches long. Hence, the resistance of the lead wires between the terminals of an indium arsenide photodetector and input terminals of a transimpedance amplifier is significant.

In a typical prior art configuration, the lead wires of an indium arsenide photodiode are connected to inverting and non-inverting input terminals of an operational amplifier having a feedback resistor connected between an output terminal and inverting input terminal of the amplifier. The operational amplifier derives a voltage which is theoretically directly proportional to the current derived by the indium arsenide photodiode and the photon rate of optical energy incident on the photodiode.

In test situations we have encountered using the aforementioned prior art circuit, it has been found that the output voltage of the amplifier is not directly proportional to the photon rate of optical energy incident on the indium arsenide photodetector. We have found that as the temperature of the indium arsenide photodetector varies, the output voltage of the amplifier does not track the photon rate of the optical energy incident on the photodetector. The error in the derived output voltage is particularly significant when it is considered that the dynamic range of an indium arsenide photodiode extends over five decades, from one nanoampere to about 10,000 nanoamperes.

It is, accordingly, an object of the present invention to provide a new and improved circuit for deriving a voltage that accurately indicates the current derived from a variable current generating source.

Another object of the present invention is to provide a new and improved circuit for deriving an output voltage that accurately represents the photon rate of optical energy incident on a photodiode, particularly an indium arsenide photodiode.

A further object of the invention is to provide a new and improved circuit for accurately indicating the current derived from an indium arsenide photodetector that is subject to different temperatures.

DISCLOSURE OF THE INVENTION

In accordance with one key aspect of the present invention, it has been discovered that the internal resistance of an indium arsenide current generating photodetector is variable, as a function of temperature.

It is, accordingly, still another object of the invention to provide a new and improved circuit for deriving an accurate indication of current magnitude derived from a current generating source having internal resistance variations.

Still another object of the invention is to provide a new and improved circuit for accurately indicating the current derived from a current generator having significant internal resistance variations and relatively high resistance lead wires connected to terminals of the current generator.

Still another object of the invention is to provide a new and improved circuit for accurately indicating the photon rate of an indium arsenide photodiode subject to relatively wide temperature variations and having relatively high resistance lead wires.

Still another object of the invention is to provide a new and improved circuit for deriving an output voltage that is directly proportional to the photon rate of optical energy incident on an indium arsenide photodiode having relatively high resistance lead wires and subject to relatively wide temperature variations as well as photon rates having a wide dynamic range.

In accordance with a further aspect of the present invention, a circuit for deriving a voltage indicative of the current derived from a transducer having a current generator and a resistance subject to variations in value, wherein the indication is independent of the resistance variations and the current is applied to first and second output terminals of the transducer, comprises a DC operational amplifier having an inverting input terminal, a non-inverting input terminal and an output terminal. The amplifier develops a voltage between the output terminal and a reference potential that is directly proportional to the current derived by the transducer independently of the resistance variations of the transducer. The result is obtained by providing four relatively high resistance lead wires, two of which are connected to each terminal of the current generator. A first lead wire is connected between the first output terminal, and the inverting-input terminal, while the second lead wire is connected between the first output terminal and one terminal of a feedback resistor of the operational amplifier. A second terminal of the feedback resistor is connected to an output terminal of the operational amplifier. The third lead wire is connected between the second terminal and the amplifier non-inverting input terminal, while the fourth lead wire is connected between the second terminal and ground.

It can be shown that the voltage derived from the amplifier is directly proportional to the current generated by the transducer, independently of the transducer resistance variations if the amplifier gain is relatively large, i.e., has a value much greater than $$\frac{R_{dm} + 2R_w + R_f}{R_{dm}}$$

where $R_{dm}$ is the minimum value of the resistance of the current generator, $R_f$ is the resistance of the feedback resistor, and $R_w$ is the approximate value of the resistance of each lead wire (while $R_w$ for each lead wire is usually about the same, this is not necessarily the case if $R_f > 4R_w = R_{w1} + R_{w2} + R_{w3} + R_{w4}$, wherein $R_{w1}$, $R_{w2}$, $R_{w3}$ and $R_{w4}$ are respectively the resistance values of the four leads connected to the amplifier from one terminal of the transducer inverting input terminal and the feedback resistors and from the other transducer terminal to the amplifier non-inverting input terminal and ground).

The amplifier output voltage under these circumstances is:

$$e_o = -I_{ph}(2R_w + R_f)$$

where $I_{ph}$ is the current generated by the current transducer.

By arranging the leads so that $R_w << R_f$, the voltage derived by the operational amplifier is directly proportional to the output current of the current transducer. Since the value of the feedback resistance is usually many times greater than that of the lead wires, the operational amplifier output voltage is basically the product of the current derived by the transducer and the value of the feedback resistance. To achieve the aforementioned results, it is necessary for the DC offset voltage of the operational amplifier to be as close to zero as possible. While offset voltages as great as 1 millivolt are tolerable, considerably improved results occur if the offset voltage is a few tens of microvolts.

The circuit is ideally suited for monitoring the output current of photodiodes, particularly indium arsenide photodiodes because of (1) the significant internal resistance variations thereof as a function of temperature, (2) the large dynamic output current range thereof as a function of photon rate of incident optical energy, and (3) the high resistance of the lead wires thereof. Adhering two lead wires to each bonding terminal of the indium arsenide photodiode has not been found to have an adverse effect on performance.

The above and still further objects, features and advantages of the present invention will become apparent upon consideration of the following detailed description of a specific embodiment thereof, especially when taken in conjunction with the accompanying drawings.

DESCRIPTION OF THE PREFERRED EMBODIMENT

Figure 1:
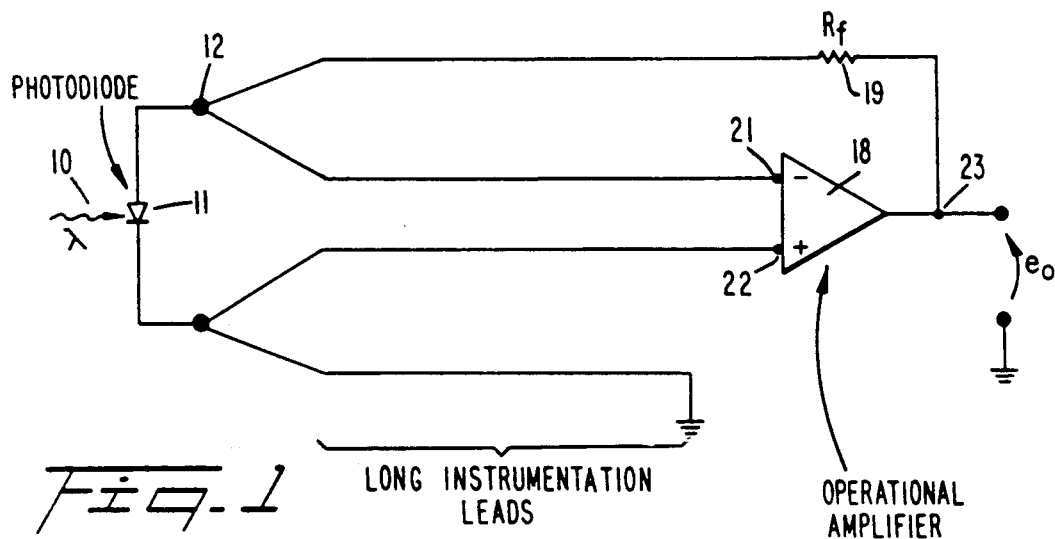
FIG. 1 is a circuit diagram of a preferred embodiment of the invention.
Figure 2:
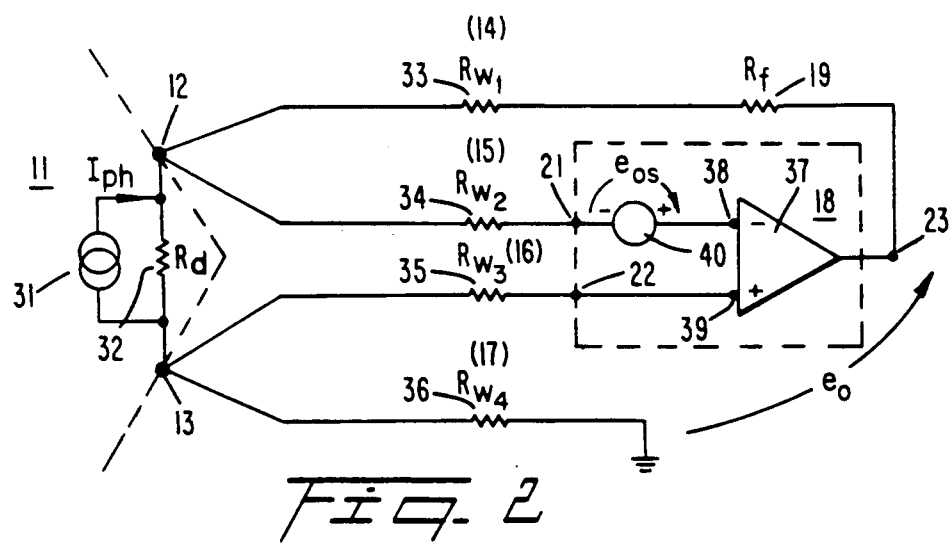
FIG. 2 is an equivalent circuit diagram of the device illustrated in FIG. 1.

Reference is now made to FIG. 1 of the drawing wherein there is illustrated indium arsenide photodiode, i.e., transducer, 11 responsive to optical energy, indicated by arrow 10. Photodetector 11 is subject to relatively large temperature variations, whether it be located in a somewhat controlled environment, such as a Dewar, or under ambient conditions. Basically, photodiode 11 can be thought of as a current generator having a dynamic range of 1 to 10,000 nanoamperes, wherein the generated current varies linearly as a function of the photon rate of incident optical energy 10. Further, indium arsenide photodiode 11 has a shunt resistance which varies as a function of the temperature of the photodiode; the minimum shunt resistance value is $R_{dm}$. Photodiode 11 includes output terminals 12 and 13. Because of the variable nature of the internal resistance of photodiode 11 the significant resistance of leads of the photodiode, the current supplied by the photodetector to terminals 12 and 13 is not linearly related to the photon rate of the optical energy incident on the photodiode.

To derive a voltage that is linearly proportional to the current generated by photodiode 11, independently of resistance variations of the photodetector, a circuit including lead wires 14–17, operational amplifier 18 and feedback resistor 19 is provided. Each of lead wires 14–17 has substantially the same resistance and is preferably formed of one mil gold wire, having a resistance of approximately 10 ohms per foot. The wires are all of the same length, anywhere between 3 inches and 1 ½ feet, depending on the application and use of the photodetector.

Lead wires 14 and 15 are both connected to terminal 12, while lead wires 16 and 17 are both connected to terminal 13. Lead wires 15 and 16 are respectively connected to inverting and non-inverting terminals 21 and 22, respectively, of operational amplifier 18. Feedback resistor 19 is connected between lead wire 14 and output terminal 23 of operational amplifier 18, while lead wire 17 is connected between terminal 13 and ground.

It will be shown that the output voltage of amplifier 18, between terminal 23 and ground, is a linear function of the output current of indium arsenide photodiode 11, independently of variations of the photodiode internal impedance. In particular, it will be shown that $e_o$, the voltage between terminal 23 and ground, is:

$$e_o = -I_{ph}(R_f + 2R_w)$$

where $I_{ph}$ equals the output current of photodetector 11, $R_f$ equals the resistance of resistor 19, and $R_w$ equals the average resistance of lead wires 14–17.

The aforementioned relationship for $e_o$ is true if the gain of amplifier 18 is sufficiently large, in particular, if the gain, A, of amplifier 18 exceeds by a reasonable margin the quantity $$\frac{R_{dm} + 2R_w + R_f}{R_{dm}}$$

Typically A > 100,00 which $$\frac{R_{dm} + 2R_w + R_f}{R_{dm}}$$

never is close to exceeding.

Reference is now made to F 2, an equivalent circuit diagram of the circuit illustrated in FIG. 1, wherein indium arsenide photodiode 11 is represented as current generator 31, shunted by resistor 32, both of which are connected across terminals 12 and 13 of the photodiode. High resistance lead wires 14, 15, 16 and 17 are respectively represented by resistors 33, 34, 35 and 36, respectively having resistance values of $R_{w1}$, $R_{w2}$, $R_{w3}$ and $R_{w4}$.

Operational amplifier 18 is represented as difference amplifier 37 having inverting and noninverting terminals 38 and 39, respectively connected to inverting and non-inverting input terminals 21 and 22 of operational amplifier 18. Operational amplifier 18 is also represented as including DC offset source 40, connected between terminals 21 and 38. Resistor 33 is connected between terminal 12 and one terminal of feedback resistor 19, having a second terminal connected to output terminal 23 of amplifier 18. Resistor 34 is connected between terminals 12 and 21, while resistor 35 is connected between terminals 13 and 22 and resistor 36 is connected between terminal 13 and ground.

It will now be shown that the output voltage of amplifier 18 between terminal 23 and ground is directly proportional to the current derived from generator 31, independently of the value of resistor 32, provided: (1) the offset voltage $e_{os}$ of offset source 39 is zero, (2) the input impedance of amplifier 40 between terminals 38 and 39 is so large that negligible current flows in resistors 34 and 35, (3) the gain, A, of amplifier 18 is sufficiently large and (4) each of resistors 33–36 has the same value. It will also be shown that the values of resistors 34 and 35 are not important, based on these assumptions which are true and practiced.

It can be shown by a superposition analysis, that:

$$e_o = \frac{\frac{-I_{ph}R_d(R_{w1} + R_{w4} + R_f)}{R_d + R_{w1} + R_{w4} + R_f} - e_{os}}{\frac{1}{A} + \frac{R_d}{R_d + R_{w1} + R_{w4} + R_f}} \quad (1)$$

Equation (1) can be simplified if A approaches infinity or if A is much greater than $$\frac{R_d + R_{w1} + R_{w4} + R_f}{R_d}$$

so that $$e_o \approx -I_{ph}(R_{w1} + R_{w4} + R_f) - e_{os}\frac{R_d + R_{w1} + R_{w4} + R_f}{R_d} \quad (2)$$

Equation (2) can be simplified by assuming that $R_w = R_{w1} = R_{w4}$, which is a reasonable assumption, so that $$e_o \approx -I_{ph}(2R_w + R_f) - e_{os}\frac{R_d + 2R_w + R_f}{R_d} \quad (3)$$

If the offset voltage, $e_{os}$, equals zero, $$e_o \approx -I_{ph}(2R_w + R_f) \quad (4)$$

From Equation (4), the output voltage of amplifier 18 is directly proportional to the current generated by source 31 and is independent of the value of resistor 32 which shunts the current source.

While there has been described and illustrated one specific embodiment of the invention, it will be clear that variations in the details of the embodiment specifically illustrated and described may be made without departing from the true spirit and scope of the invention as defined in the appended claims. For example, the principles of the invention are applicable to other current generating transducers having variable internal resistance.

We claim:

1. A photodetector circuit comprising a photodiode having: (a) first and second terminals, (b) a current generator for deriving a current having an amplitude directly proportional to photons incident thereon, and (c) a resistance affecting the amount of current supplied by a current generator to the first and second terminals, a DC operational amplifier having: an inverting input terminal, a non-inverting input terminal and an output terminal, the amplifier developing a voltage between the output terminal and a reference potential level; a feedback resistor; first, second, third and fourth electric lead wires having appreciable resistance that is substantially the same for each lead wire; the first lead wire and the feedback resistor being connected in series between the first terminal and the amplifier output terminal, the second lead wire being connected between the first terminal and the inverting input terminal, the third lead wire being connected between the second terminal and the non-inverting input terminal, the fourth lead wire being connected between the second terminal and a terminal at the reference potential level, the lead wires being connected to: the first and second terminals, the feedback resistor, the amplifier input terminals and the terminal at the reference potential level so that the voltage between the amplifier output terminal and the reference potential level is directly proportional to the photon rate of the optical energy incident on the photodiode substantially independently of variations in the value of the photodiode resistance.

2. The photodetector circuit of claim 1 wherein the photodiode has InAs as active material.

3. The photodetector circuit of claim 2 wherein each of the leads consists essentially of gold and has a diameter of about 1 mil.

4. The photodetector circuit of claim 1 wherein the amplifier has a gain substantially greater than:

$$\frac{R_{dm} + 2R_w + R_f}{R_{dm}}$$

where $R_{dm}$ is the minimum value of the photodiode resistance, $R_w$ is the average value of the resistance of each lead wire, and $R_f$ is the value of the resistance of the feedback resistance.

5. The photodetector circuit of claim 4 wherein the amplifier has an offset voltage of approximately zero.

6. The photodetector circuit of claim 1 wherein the amplifier has an offset voltage of approximately zero.

7. A circuit for deriving a voltage indicative of current derived from a transducer having a current generator and a resistance subject to variations in value, the indication being independent of the resistance variations, the current being applied to first and second terminals of the transducer, the amount of current being applied to the first and second terminals being dependent on the value of the resistance, the circuit comprising a DC operational amplifier having: an inverting input terminal, a noninverting input terminal and an output terminal, the amplifier developing a voltage between the output terminal and a reference potential level; a feedback resistor; first, second, third and fourth electric lead wires having appreciable resistance that is substantially the same for each lead wire; the first lead wire and the feedback resistor being connected in series between the first terminal and the amplifier output terminal, the second lead wire being connected between the first terminal and the inverting input terminal, the third lead wire being connected between the second terminal and the non-inverting input terminal, the fourth lead wire being connected between the second terminal and a terminal at the reference potential level, the lead wires being connected to: the first and second terminals, the feedback resistor, the amplifier input terminals and the terminal at the reference potential level so that the voltage between the amplifier output terminal and the reference potential level is directly proportional to the current derived by the transducer independently of the variations in value of the resistance.

8. The circuit of claim 7 wherein the amplifier has a gain substantially greater than:

$$\frac{R_{dm} + 2R_w + R_f}{R_{dm}}$$

where $R_{dm}$ is the minimum value of the transducer resistance, $R_w$ is the average value of the resistance of each lead wire, and $R_f$ is the value of the resistance of the feedback resistance.

9. The circuit of claim 8 wherein the amplifier has an offset voltage of approximately zero.

10. The circuit of claim 7 wherein the amplifier has an offset voltage of approximately zero.

* * * * *